(12) United States Patent
Yang et al.

(10) Patent No.: US 7,343,462 B2
(45) Date of Patent: Mar. 11, 2008

(54) METHOD FOR USING NON-VOLATILE MEMORY AND ELECTRONICS DEVICE THEREOF

(75) Inventors: Ying-Chih Yang, Hsinchu (TW); Yu-Chi Chen, Hsinchu (TW); Yuan-Ning Chen, Hsinchu (TW); Chien-Min Chen, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 367 days.

(21) Appl. No.: 10/904,184

(22) Filed: Oct. 28, 2004

(65) Prior Publication Data

US 2006/0018173 A1 Jan. 26, 2006

(30) Foreign Application Priority Data

Jul. 20, 2004 (TW) .............................. 93121576 A

(51) Int. Cl.
*G06F 12/02* (2006.01)
(52) U.S. Cl. .................... 711/165; 711/103; 717/169
(58) Field of Classification Search ............... 711/165, 711/103; 717/169
See application file for complete search history.

(56) References Cited

U.S. PATENT DOCUMENTS

| | | | |
|---|---|---|---|
| 6,026,016 A * | 2/2000 | Gafken | 365/185.04 |
| 6,449,625 B1 * | 9/2002 | Wang | 707/206 |
| 6,591,329 B1 * | 7/2003 | Kakinuma et al. | 711/103 |
| 6,708,045 B1 * | 3/2004 | Lieu et al. | 455/557 |
| 6,880,075 B1 * | 4/2005 | Fukano et al. | 713/1 |
| 2002/0026607 A1 * | 2/2002 | Takahashi et al. | 714/718 |
| 2002/0092023 A1 * | 7/2002 | Kaizu et al. | 725/58 |
| 2003/0110343 A1 * | 6/2003 | Hagiwara et al. | 711/5 |
| 2005/0021903 A1 * | 1/2005 | Baxter, Jr. | 711/100 |
| 2005/0089311 A1 * | 4/2005 | Dai et al. | 386/109 |
| 2005/0149729 A1 * | 7/2005 | Zimmer et al. | 713/168 |
| 2005/0226054 A1 * | 10/2005 | Yeh et al. | 365/185.28 |

* cited by examiner

*Primary Examiner*—Matthew Kim
*Assistant Examiner*—Shane M Thomas
(74) *Attorney, Agent, or Firm*—Jianq Chyun IP Office

(57) ABSTRACT

A method for using non-volatile memory and an electronics device thereof is provided. The method includes the following steps. First, a non-volatile memory pre-loaded with a plurality of original data is provided. When updating the original data with new data, if free space is available in the non-volatile memory, then the new data is written into the free space. If free space is not available, all the updated original data is written into the erased non-volatile memory.

18 Claims, 3 Drawing Sheets they will be erased each time the original data is updated. Since the erase/rewrite lifecycle of the general flash memory is about 100,000 times, frequent erase/rewrite operation will shorten the lifecycle of the flash memory.

METHOD FOR USING NON-VOLATILE MEMORY AND ELECTRONICS DEVICE THEREOF

CROSS-REFERENCE TO RELATED APPLICATION

This application claims the priority benefit of Taiwan application serial no. 93121576, filed on Jul. 20, 2004.

BACKGROUND OF THE INVENTION

1. Field of the Invention

The present invention relates to a method for using a memory and a device thereof, and more particularly, to a method for using a non-volatile memory and an electronics device thereof.

2. Description of the Related Art

The memories, which can be accessed by a system, are roughly categorized into volatile memories and non-volatile memories based on their characteristic. The volatile memories include Dynamic Random Access Memory (DRAM) and Static Random Access Memory (SRAM), and the data stored in the volatile memory disappears once the system is turned off (when the electricity provided to the memory discontinues). The volatile memory has the advantage of fast read/write operation and is capable of rewriting without erasing its content first. On the other hand, the data stored in the non-volatile memory does not disappear when the system is turned off (when the electrical power provided to the memory discontinues), but the content needs to be erased before the data is rewritten into the non-volatile memory. Among various types of the non-volatile memory, the flash memory is one good example.

The flash memory is commonly used for storing the system firmware or even the system parameter. The flash memory is characterized by its lengthy erase time by one sector at a time. In general, a sector erase time in the flash memory is about 1 (typical value) to 8 (maximum value) seconds, and a byte programming time is about 35 (typical value) to 300 (maximum value) μs (micro seconds). It is common practice for the system to store a set of certain parameters data in a flash memory. Each time a user performs new operations on the system, the system will erase these data first and then rewrite the new data into the non-volatile memory. The operation of erasing the content and rewriting the data into the non-volatile memory for storing system configuration or other information, if frequent, can slow down the system due to the lengthy erase time. In addition, the erase/rewrite lifecycle of the general flash memory is about 100,000 times. Frequent erase/rewrite operation will shorten the lifecycle of the flash memory and degrade its reliability.

SUMMARY OF THE INVENTION

Accordingly, an object of the present invention is to provide a method for using a non-volatile memory, wherein new data is written into the free space of the non-volatile memory when updating the original data, and the content of the non-volatile memory is not erased until the capacity of the non-volatile memory is exhausted, such that the number of the erase operation is reduced and the lifecycle of the non-volatile memory is prolonged.

Another object of the present invention is to provide an electronics device employing the non-volatile memory. In addition to the object mentioned above, a physical device is embodied in order to implement the present invention.

The present invention provides a method for using a non-volatile memory, comprising the following steps. First, a non-volatile memory having a original data area pre-loaded with a plurality of original data and having a new data area is provided. When updating the plurality of original data with new data, if free space is available in the new data area, then the new data is written into the free space of the new data area. If no free space is available, then updating the plurality of original data read from the original data area with the new data and the data read from the new data area, the non-volatile memory as a whole is erased, and the plurality of original data updated is written into the original data area erased.

The present invention further provides an electronics device employing a non-volatile memory. The electronics device comprises a non-volatile memory and a controller. The non-volatile memory has a original data area pre-loaded with a plurality of original data and a new data area, wherein the plurality of original data are the system parameter of the electronics device. The controller is electrically coupled to the non-volatile memory. When updating the original data with new data, if free space is available in the new data area, then the new data is written into the free space of the new data area. If no free space is available in the new data area, then the plurality of original data read from the original data area are updated with the new data and the data read from the new data area, the non-volatile memory as a whole is erased, and the plurality of original data updated is written into the original data area erased.

In the present invention, since the new data is written into the free space of the non-volatile memory when updating the original data, the content of the non-volatile memory is not erased until the capacity of the non-volatile memory is exhausted. This is unlike the prior art, where the content of the non-volatile memory is erased each time the original data is updated in the non-volatile memory. Therefore, in the present invention, the erase operations are significantly reduced, and the object of saving erase time and prolonging the lifecycle of the non-volatile memory can be achieved.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE EMBODIMENTS

Figures 1A, 1B:
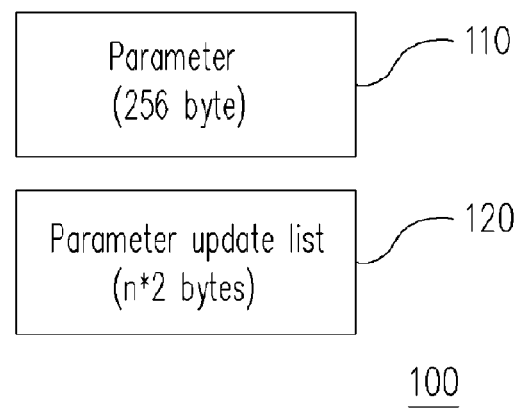
FIG. 1A schematically shows an area block diagram of a memory according to one embodiment of the present invention.
FIG. 1B schematically shows a data structure diagram of a system parameter update table shown in FIG. 1A according to one embodiment of the present invention.

In the conventional technology, since the non-volatile memory (for a clear explanation, only the flash memory is exemplified hereinafter) is not used by dividing it into a plurality of areas, the whole content of the non-volatile memory has to be erased before the data can be written into it each time an operation is made. In one embodiment of the present invention, the flash memory is divided into a plurality of areas before it is utilized. FIG. 1A schematically shows an area block diagram of a memory according to one embodiment of the present invention. With reference to FIG. 1A, the flash memory 100 comprises an original data area 110 and a new data area 120. Wherein, the original data area 110 can be used for storing the system parameter, and it is assumed that the original data can save 256 bytes of data. The new data area 120 can be used for storing a parameter update list.

In this embodiment, the data structure of the parameter update list can refer to the embodiment shown in FIG. 1B. FIG. 1B schematically shows a data structure diagram of a parameter update list 120 shown in FIG. 1A according to one embodiment of the present invention. As shown in FIG. 1B, a plurality of areas for storing parameters (e.g. areas 121~124) are planned on the new data area 120 of the flash memory 100. Each time the new data needs to be written, a non-used area is selected. For example, the new data is written in an ascending order starting from the area 121, and the whole data is totally erased in one time when the entire new data area 120 is full.

Figure 2:
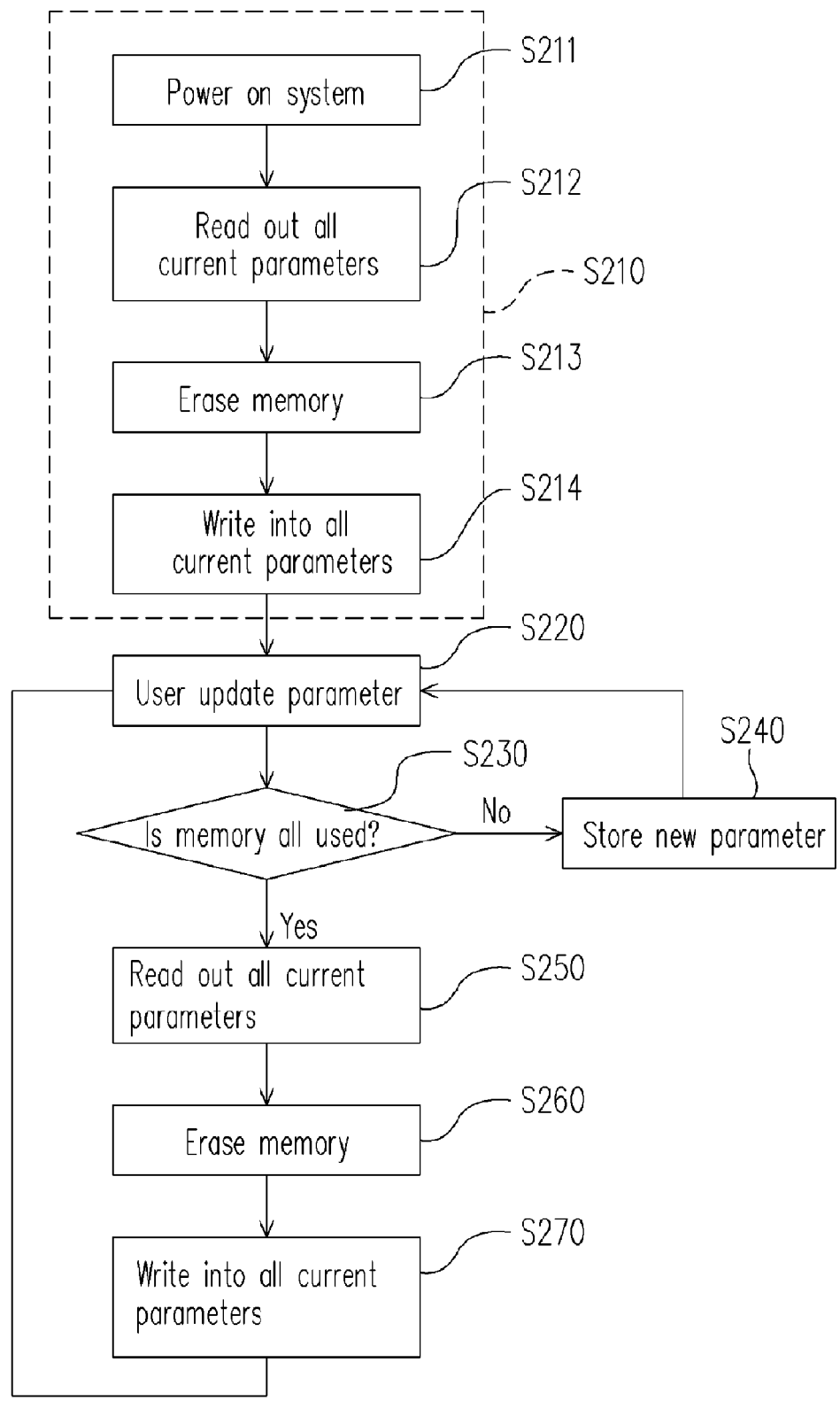
FIG. 2 schematically shows a flow chart illustrating a method for using non-volatile memory according to one embodiment of the present invention.

The method for updating the parameter in the flash memory 100 is described in detail hereinafter. FIG. 2 schematically shows a flow chart illustrating a method for using non-volatile memory according to one embodiment of the present invention. As shown in FIGS. 1A, 1B, and 2, since it is the characteristic of the flash memory that all of the erased data read out from the memory is 1, an address or data with all bit values equal to 1 can be used to indicate the completion of the update data (e.g. as shown in area 123 and area 124). In addition, each bit of value 1 in the address or data also indicates that it is free space.

Initially, a plurality of parameter data is pre-loaded in the original data area 110 of the flash memory 100. In step S220, when the user operates the system and modifies a certain parameter (e.g. updating the original data of address 0x20 in the original data area 110 to 0x17), the availability of free space is examined in the new data area 120 (step S230). If there is free space, step S240 follows, where the address and the data of the parameter to be updated are sequentially written into the new data area 120 (e.g. area 121). Meanwhile (step S220), assuming that the system needs to update its parameter data again (e.g. updating the original data of address 0x32 in the original data area 110 to 0x20), and there is free space in the new data area 120 (step S230), the system then sequentially writes the address and the data of the parameter to be updated into the new data area 120 (e.g. area 122) (step S240). The same processes are repeated until the capacity of the new data area 120 is exhausted, and a step S250 is performed thereafter.

In step S250, when the new data area is full, all data in the flash memory 100 are read out, and the original data (parameter data) in the original data area 110 is sequentially updated based on the records in the parameter update list, and the updated parameter is reserved for the subsequent step. The step S260 then follows, where all data in the flash memory 100 are erased. After the erase, the step S270 is performed, where the updated parameter reserved in step S250 is written into the original data area 110.

As mentioned above, after the system has erased the whole content of the flash memory 100 and has written the updated parameter content into the original data area 110, the new data area is cleaned up and ready for the parameter update. Since the capacity of the written data is small (as exemplified in the present invention, only 2 bytes are updated in each update), the number of the erase operations is reduced accordingly, which greatly improves the response time and prolongs the flash memory lifecycle.

Furthermore, in order to reduce the erase operation after the whole new data area 120 is full, the system can be tuned each time it is booting, such that the parameter in the original data area 110 can be updated accordingly. By adding a step S210, the present embodiment is able to achieve the object mentioned above. In other words, each time when booting the system (step S211), all data in the flash memory 100 are read out (step S212), and the original data (parameter data) in the original data area 110 is sequentially updated based on the records in the parameter update list, and the updated parameter is reserved for the subsequent step. Then, all data in the flash memory 100 are erased (step S213). After the erase, the updated parameter reserved in step S212 is written into the original data area 110 (step S214). Therefore, the new data area 120 is empty and ready for the parameter update.

Figure 3:
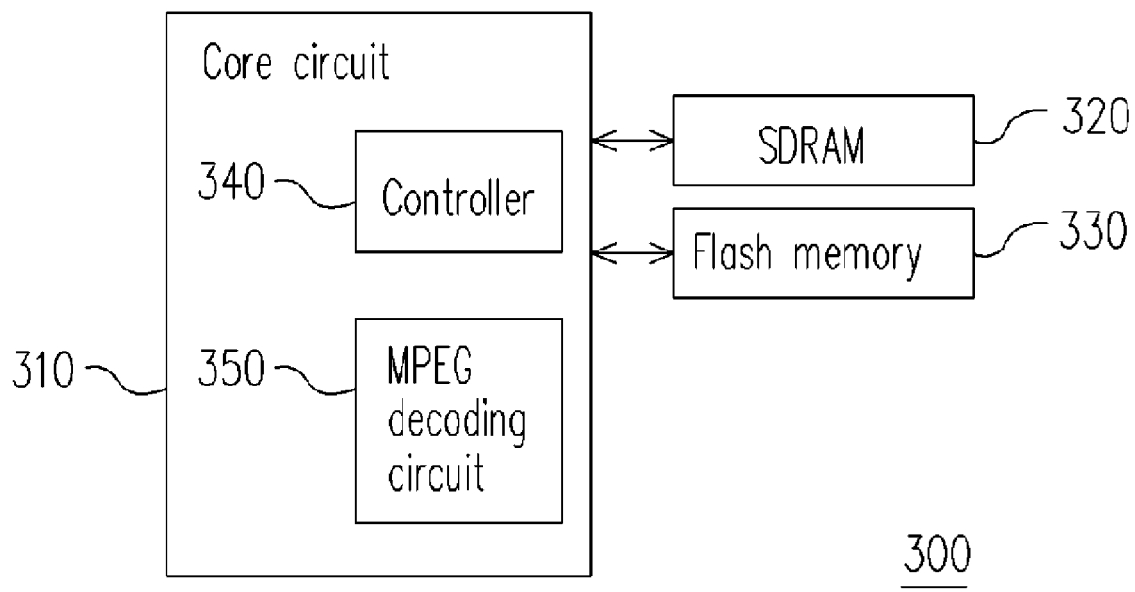
FIG. 3 schematically shows a partial circuit block diagram of a DVD player according to another embodiment of the present invention.

For a better understanding of the present invention, an embodiment is further exemplified hereinafter. In the present embodiment, a DVD player is used as an example for describing the spirit of the present invention, but it should not be interpreted in a limiting sense. FIG. 3 schematically shows a partial circuit block diagram of a DVD player according to another embodiment of the present invention. With reference to FIG. 3, the DVD player 300 comprises a core circuit 310, a Synchronous Dynamic Random Access Memory (SDRAM) 320, and a non-volatile memory 330 (a flash memory is exemplified herein). In addition, a plurality of original data (e.g. the parameter data in the present embodiment) is pre-loaded in the flash memory 330.

The core circuit 310 comprises a controller 340 and a MPEG decoding circuit 350. The controller 340 is directly or indirectly electrically coupled to the flash memory 330. When updating the original data with new data, if free space is available in the flash memory 330, the controller 340 can write the new data into the free space of the flash memory 330. If free space is not available, the controller 340 reads all data out from the flash memory 330. Wherein, the structure used by the flash memory 100 to store data is shown in FIGS. 1A and 1B. After the updated data is full, all data in the flash memory 330 (e.g. the flash memory 110 shown in FIG. 1A) are read out, and the original data (parameter data) in the original data area 110 is sequentially updated based on the records in the parameter update list of the new data area 120, and the entire updated parameter is cached in the SDRAM 320. Then, the controller 340 issues an erase instruction to erase all data in the flash memory 330. After the erase, the controller 340 writes the updated parameter reserved in the SDRAM 320 into the original data area 110. Since other related methods can be implemented as the description of the embodiment mentioned above, its detail description is spared herein.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method for using a non-volatile memory, comprising following steps:
   a. providing the non-volatile memory having a original data area pre-loaded with a plurality of original data, and having a new data area;
   b. when updating the plurality of original data with a new data, if free space is available in the new data area, then writing the new data into the free space of the new data area;
   c. when updating the plurality of original data with the new data, if free space is not available in the new data area, then updating the plurality of original data read from the original data area with the new data and data read from the new data area, erasing the non-volatile memory as a whole, and writing the plurality of original data updated into the original data area erased; and
   d. reading out all data stored in the non-volatile memory, reserving a final update result of the plurality of original data, erasing the non-volatile memory as a whole, and writing the final update result of the plurality of original data into the non-volatile memory when booting an electronics device having the non-volatile memory.

2. The method for using the non-volatile memory of claim 1, wherein the step c comprises:
   reading out the plurality of original data from the original data area;
   reading out the data from the new data area;
   reserving the new data;
   updating the plurality of original data read from the original data area with the new data and the data read from the new data area;
   erasing the non-volatile memory as a whole; and
   writing the plurality of original data updated into the original data area in the non-volatile memory erased.

3. The method for using the non-volatile memory of claim 1, wherein the step c comprises sequentially writing the plurality of original data updated starting from a beginning address of the original data area erased in the non-volatile memory.

4. The method for using the non-volatile memory of claim 1, wherein in step b, an address where the new data is written into is adjacent to occupied space of the new data area.

5. The method for using the non-volatile memory of claim 1, wherein when updating the plurality of original data in the original data area, the new data is sequentially written into the new data area.

6. The method for using the non-volatile memory of claim 5, wherein the new data comprises an address information and a current data, and the address information indicates an address of the original data area where the plurality of original data to be updated is stored, and the current data is the new data to be updated in an address indicated by the address information.

7. The method for using the non-volatile memory of claim 1, wherein the non-volatile memory is a flash memory.

8. The method for using the non-volatile memory of claim 1, wherein the original data is a parameter of an audio/video player.

9. The method for using the non-volatile memory of claim 8, wherein the audio/video player is an optical disc player.

10. An electronics device employing a non-volatile memory, comprising:
    the non-volatile memory, for having a original data area pre-loaded with a plurality of original data, and having a new data area, wherein the plurality of original data are a parameter of the electronics device; and
    a controller electrically coupled to the non-volatile memory, used when updating the plurality of original data with new data, if free space is available in the new data area, then the new data is written into the free space of the new data area, otherwise, the plurality of original data read from the original data area are updated with the new data and data read from the new data area, the non-volatile memory as a whole is erased and the plurality of original data updated are written into the original data area erased,
    wherein when booting the electronics device, the controller first reads all data stored in the non-volatile memory and reserves a final update result of the plurality of original data, then erases the non-volatile memory, and writes the final update result of the plurality of original data into the non-volatile memory.

11. The electronics device employing the non-volatile memory of claim 10, wherein when the controller updates the plurality of original data with new data, if free space is not available in the new data area, all data stored in the non-volatile memory is read out to update the plurality of original data read from the original data area with the new data and the data read from the new data area, and a final update result of the plurality of original data is reserved, and then the non-volatile memory is erased before the final update result of the plurality of original data is written into the non-volatile memory.

12. The electronics device employing the non-volatile memory of claim 10, wherein the new data is sequentially written starting from a beginning address of the original data area erased.

13. The electronics device employing the non-volatile memory of claim 10, wherein the address where the new data is written into by the controller is adjacent to-occupied space of the new data area.

14. The electronics device employing the non-volatile memory of claim 10, wherein the plurality of original data pre-loaded are stored in the original data area, and when the controller updates the plurality of original data in the original data area, the new data is sequentially written into the new data area.

15. The electronics device employing the non-volatile memory of claim 14, wherein the new data comprises an address information and a current data, and the address information indicates an address of the original data area where the plurality of original data to be updated is stored, and the current data is the new data to be updated in an address indicated by the address information.

16. The electronics device employing the non-volatile memory of claim 10, wherein the non-volatile memory is a flash memory.

17. The electronics device employing the non-volatile memory of claim 10, wherein the electronics device is an audio/video player.

18. The electronics device employing the non-volatile memory of claim 10, wherein the electronics device is an optical disc player.

* * * * *